United States Patent [19]

Taguchi

[11] Patent Number: 4,622,570
[45] Date of Patent: Nov. 11, 1986

[54] SEMICONDUCTOR MEMORY

[75] Inventor: Masao Taguchi, Sagamihara, Japan

[73] Assignee: Fujitsu Limited, Kawasaki, Japan

[21] Appl. No.: 615,675

[22] Filed: Jun. 1, 1984

Related U.S. Application Data

[63] Continuation of Ser. No. 218,801, Dec. 22, 1980.

[30] Foreign Application Priority Data

Dec. 24, 1979 [JP] Japan .................. 54-167828

[51] Int. Cl.⁴ .............. H01L 29/78; H01L 27/02; H01L 29/04; G11C 11/34
[52] U.S. Cl. .................. 357/23.6; 357/41; 357/51; 357/59; 365/186
[58] Field of Search ............ 357/23.5–23.8, 357/23.12, 23.14, 41, 51, 46, 59, 91; 365/186

[56] References Cited

U.S. PATENT DOCUMENTS

| | | | |
|---|---|---|---|
| 3,339,128 | 8/1967 | Olmstead et al. | 357/23.12 |
| 3,825,946 | 7/1974 | Frohman-Bentchowsky | 365/185 |
| 3,984,822 | 10/1976 | Simko et al. | 365/185 |
| 3,996,658 | 12/1976 | Takei et al. | 357/24 |
| 4,004,159 | 1/1977 | Rai et al. | 357/59 X |
| 4,109,372 | 8/1978 | Geffken | 375/59 X |
| 4,112,575 | 9/1978 | Fu et al. | 357/41 X |
| 4,151,537 | 4/1979 | Goldman et al. | 357/59 X |
| 4,240,092 | 12/1980 | Kuo | 357/41 X |
| 4,300,212 | 11/1981 | Simko | 357/23 VT |
| 4,313,253 | 2/1982 | Henderson, Sr. | 357/41 X |
| 4,329,706 | 5/1982 | Crowder et al. | 357/59 X |

OTHER PUBLICATIONS

P. E. Schmidt et al, "D.C. and High-Frequency Characteristics of Built-In Channel MOS-FETs", *Solid-State Electronics*, vol. 21 (1978) pp. 495-505.

R. A. Haken, "Analysis of the Deep Depletion MOS-FET and the Use of the D.C. Characteristics for Determining Bulk-Channel Charge-Coupled Device Parameters", *Solid-State Electronics*, vol. 21 (1978), pp. 753-761.

C. G. Jambotkar et al, "Stacked Gate Device with Reduced '0' State Threshold Voltge", *IBM Technical Disclosure Bulletin*, vol. 22 (1979), pp. 160-161.

K. Nishiuchi, H. Oka, T. Nakamura, H. Ishikawa and M. Shimoda in "A Normally-Off Type Buried Channel MOSFET for VLSI Circuits", *I.E.D.M. Technical Digest* (1978), pp. 26-29.

*Primary Examiner*—J. Carroll
*Attorney, Agent, or Firm*—Staas & Halsey

[57] ABSTRACT

A semiconductor memory device of a one-transistor type is manufactured by using a so-called double-layer technology. The device comprises a buried-channel type transistor having normally-off characteristics and a capacitor having normally-on characteristics to provide high integrated density. An insulating layer between two conductive layers for forming the transistor and the capacitor is relatively thick to provide increased breakdown voltage and reduced parasitic capacitance.

18 Claims, 13 Drawing Figures

SEMICONDUCTOR MEMORY

This application is a continuation of application Ser. No. 218,801, filed Dec. 22, 1980.

BACKGROUND OF THE INVENTION

The present invention relates generally to a semiconductor memory device and, more particularly, to a MIS (Metal-Insulator-Semiconductor) memory device of a one-transistor type.

In general, a MOS (broadly, MIS) memory device of a one-transistor type comprises a MOS transistor and in addition, a MOS capacitor. In this case, the transistor is used for charging or discharging the capacitor and the presence of charges in the capacitor corresponds to the information "0" or "1".

The above-mentioned transistor has a source (or drain) connected to a bit line, a gate connected to a word line and a drain (or source) connected to a first electrode of the capacitor which, in turn, has a second electrode connected to a power supply line.

According to a first conventional MOS memory device of a one-transistor type, the device is manufactured by using a so-called one-layer polycrystalline silicon technology. That is, the gate of the transistor and the second electrode of the capacitor are manufactured at the same time. However, in this device, an impurity doped region is required for connecting an inversion region (a channel region) of the transistor to an inversion region (the first electrode) of the capacitor. In addition, the field area thereof, which is explained below, is relatively large. As a result, the device is large and accordingly, the integrated density thereof is small.

According to a second conventional MOS memory device of a one-transistor type, the device is manufactured by using a so-called double-layer polycrystalline silicon technology. That is, the gate of the transistor is made of a first (lower) polycrystalline silicon layer, while the second electrode of the capacitor is made of a second (upper) polycrystalline silicon layer. In this device, the first and second polycrystalline silicon layers can be arranged so closely as to omit such an impurity region as mentioned in the first conventional device. In addition, the capacitor can be of a depletion type by using an E/D (enhancement/depletion) MOS manufacturing method, so that the charge storage of the capacitor can be increased. In other words, the capacitor can be of a small size. Therefore, the second conventional device is smaller than the first conventional device. However, the second conventional device is still relatively large.

According to a third conventional MOS memory device of a one-transistor type, the device is also manufactured by using a so-called double-layer polycrystalline silicon technology. However, the second electrode of the capacitor is made of the first polycrystalline silicon layer, while the gate of the transistor is made of the second polycrystalline silicon layer. In the third conventional device, active areas comprising impurity doped regions or the like can be interdigitally arranged so as to reduce the field area and accordingly, the area of the entire device. Therefore, a highly integrated density can be attained.

However, in the above-mentioned third conventional device, since the gate of the transistor is disposed partly on the second electrode of the capacitor, it is impossible to use an E/D MOS manufacturing method to the cell area, so that the capacitor is of an enhancement type. As a result, the charge storage of the capacitor is small; in other words, the capacitor is of a large size which enlarges the entire device. In addition, since the thickness of the insulating layer between the two polycrystalline silicon layers is small, the breakdown voltage of the insulating layer is low which invites a low reliability of operation and, in addition, the parasitic capacitance of each of the conductive layers is large which invites a low speed of operation.

SUMMARY OF THE INVENTION

It is an object of the present invention to provide a semiconductor memory device of a one-transistor type with a highly integrated density.

It is another object of the present invention to provide a semiconductor memory device of a one-transistor type facilitating a high reliability of operation and a high speed of operation while retaining the high integrated density of the third conventional device.

According to the present invention, there is provided a semiconductor memory device of a one-transistor type, comprising: a semiconductor substrate of a first conductivity type including therein first and second impurity doped regions of a second conductivity type opposite to the first conductivity type, the second impurity doped region having a higher concentration than the first impurity region; a first insulating layer disposed partly over the first impurity region; a first conductive layer disposed on the first insulating layer; a second insulating layer having a thin portion disposed directly on the first impurity doped region and having a thick portion extended over the first conductive layer; a second conductive layer disposed on the second insulating layer; a buried-channel type transistor having normally-off characteristics comprising a source and a drain formed by the second and first impurity doped regions and a channel formed by the first impurity doped region directly below the second conductive layer which serves as a gate electrode thereof; and a capacitor having normally-on characteristics comprising a first electrode formed by the first impurity doped region and a second electrode formed by the first conductive layer. In this device, since the capacitor is of a normally-on type, the charge storage thereof is large so as to reduce the area of the capacitor and accordingly, the entire device. In addition, the second insulating layer between the two conductive layers can be so thick as to enlarge the breakdown voltage of the second insulating layer, since the first impurity region always exists in the substrate between the two conductive layers, which is helpful in improving the reliability of operation. Further, the parasitic capacitance of each of the conductive layers is reduced, so as to increase the speed of operation.

DESCRIPTION OF THE DRAWINGS

The present invention will be more clearly understood from the description as set forth below contrasting the present invention with the conventional devices and with reference to the accompanying drawings, wherein.

DESCRIPTION OF THE PREFERRED EMBODIMENTS

Figure 1:
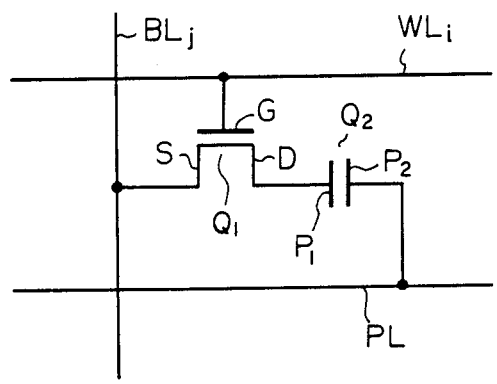
FIG. 1 is a circuit diagram illustrating an equivalent circuit of a semiconductor memory device of a one-transistor type.

Referring to FIG. 1, which illustrates an equivalent circuit of a semiconductor memory device of a one-transistor type, the device comprises a transfer transistor $Q_1$ and a capacitor $Q_2$. The transistor $Q_1$ has a source S connected to a bit line $BL_j$, a gate G connected to a word line $WL_i$ and a drain D connected to an electrode $P_1$ of the capacitor $Q_2$ which, in turn, has another electrode $P_2$ connected to a power supply line PL.

The transistor $Q_1$ is used for charging or discharging the capacitor $Q_2$. For example, when the potential of the word line $WL_i$ is high (in this case, the transistor $Q_1$ is of an n-channel type), the bit line $BL_j$ is electrically connected to the electrode $P_1$ of the capacitor $Q_2$ so that charges are transferred from the bit line $BL_j$ to the electrode $P_1$ or vice versa responsive to the potential of the bit line $BL_j$. In this case, the presence of charges in the electrode $P_1$ of the capacitor $Q_2$ corresponds to the information "0" or "1".

Figure 2:
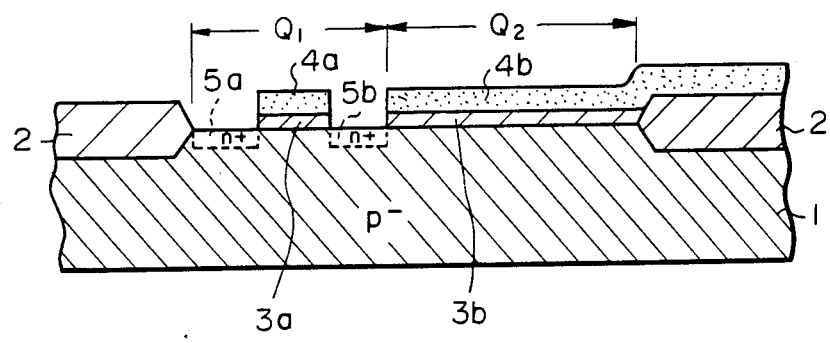
FIG. 2 is a cross-sectional view of a first conventional semiconductor memory device of a one-transistor type.

FIG. 2 is a cross-sectional view of a first conventional semiconductor memory device of a one-transistor type. The device of FIG. 2 is manufactured by using a so-called one-layer polycrystalline silicon technology. (This technology is disclosed in U.S. Pat. No. 3,996,658.) In FIG. 2, reference numeral 1 is a semiconductor substrate which is made of, for example, P⁻-type monocrystalline silicon; 2 is a field layer which is relatively thick and made of, for example, silicon dioxide; $3a$ and $3b$ are gate insulating layers which are relatively thin and made of, for example, silicon dioxide; $4a$ is a gate electrode of the transistor $Q_1$ which is made of, for example, polycrystalline silicon; $4b$ is an electrode of the capacitor $Q_2$ which is made of, for example, polycrystalline silicon; $5a$ is an n⁺-type impurity doped region which serves as a source (or drain) of the transistor $Q_1$; and $5b$ is an n⁺-type impurity doped region which serves as a drain (or source) of the transistor $Q_1$.

In FIG. 2, an area covered by the field layer 2 is called a field area which is used for isolating the device (memory cell) comprised of the elements $Q_1$ and $Q_2$ from other devices, while another area in which the insulating layers $3a$ and $3b$ and the impurity regions $5a$ and $5b$ are disposed is called an active area.

In FIG. 2, the gate electrode $4a$ of the transistor $Q_1$ and the electrode $4b$ of the capacitor $Q_2$ are manufactured at the same time. Therefore, the manufacturing method is called a one-layer polycrystalline silicon method. According to this method, the impurity doped region $5b$ is indispensable for connecting an inversion region (channel region) which is generated directly below the insulating layer $3a$ to another inversion region which serves as another electrode of the capacitor $Q_2$ and is generated directly below the insulating layer $3b$, since the two inversion regions cannot be connected directly to each other due to the difference in potential therebetween.

Figure 3A:
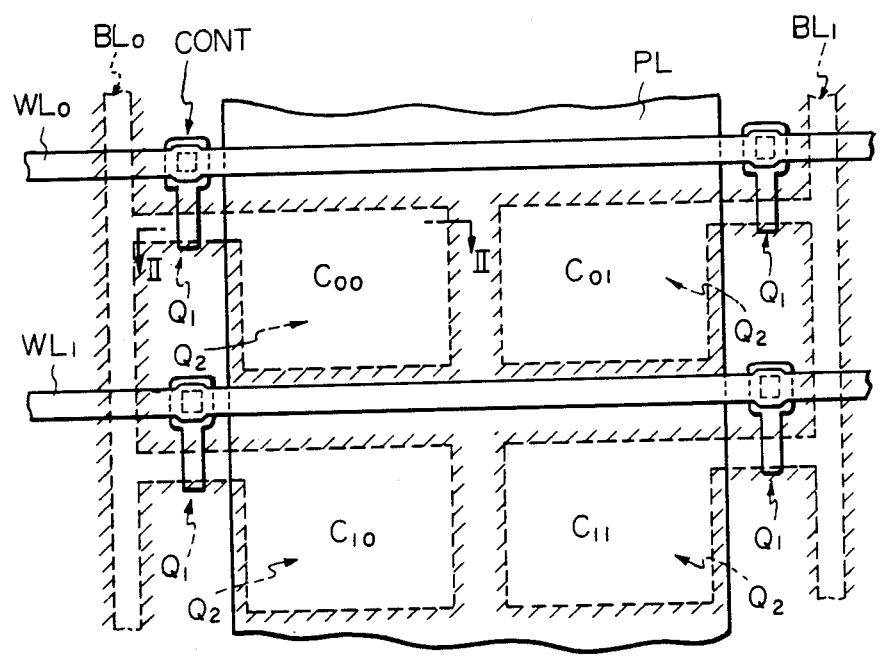
FIGS. 3A and 3B are plan views of two examples of the device of FIG. 2.
Figure 3B:
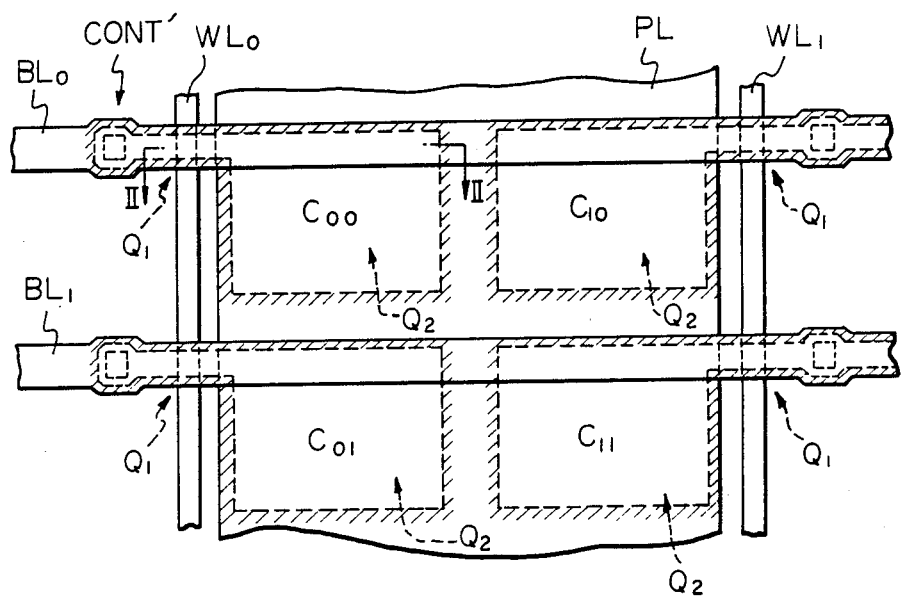

FIGS. 3A and 3B are plan views of two examples of the device of FIG. 2. In FIGS. 3A and 3B, there are four memory cells $C_{00}$, $C_{01}$, $C_{10}$ and $C_{11}$ each of which corresponds to the device of FIG. 2. In addition, a power supply line PL, which is common to all the cells $C_{00}$, $C_{01}$, $C_{10}$ and $C_{11}$, is made of, for example, polycrystalline silicon which is the same as the electrode $4b$ of FIG. 2.

In FIG. 3A, bit lines $BL_0$ and $BL_1$ are made of n⁺-type impurity doped regions common to the source (or drain) of the transistor $Q_1$ of each of the cells $C_{00}$, $C_{01}$, $C_{10}$ and $C_{11}$. In addition, word lines $WL_0$ and $WL_1$ are made of, for example, aluminum which is connected to the gate electrode $4a$ (FIG. 2) of each transistor $Q_1$ through a contact throughhole CONT. Contrary to this, in FIG. 3B, word lines $WL_0$ and $WL_1$ are made of, for example, polycrystalline silicon which corresponds to the gate electrode $4a$ (FIG. 2). In addition, bit lines $BL_0$ and $BL_1$ are made of, for example, aluminum which is connected to the source (or drain) of the transistor $Q_1$ of each cell through a contact throughhole CONT'. In both FIGS. 3A and 3B, the field area, which, in this case, is shaded, is relatively large so as to increase the area of the memory cells.

Thus, the integrated density of the device of FIG. 2 is small, since the impurity doped region $5b$ is necessary and the field area is relatively large.

It should be noted that FIG. 2 is a cross-sectional view along the lines II—II of FIGS. 3A or 3B.

Figure 4:
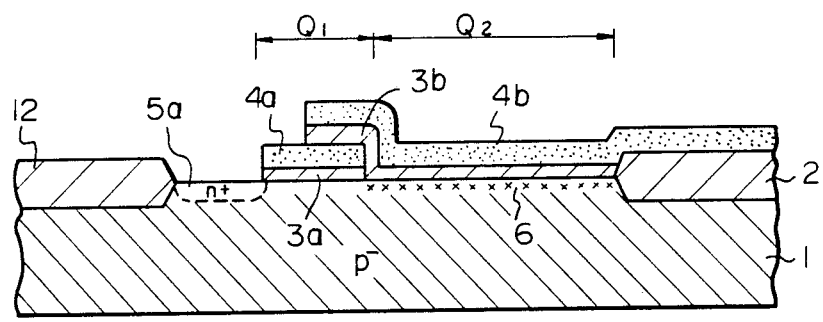
FIG. 4 is a cross-sectional view of a second conventional semiconductor memory device of a one-transistor type.

FIG. 4 is a cross-sectional view of a second conventional semiconductor memory device of a one-transistor type. In FIG. 4, the gate electrode $4a$ of the transistor $Q_1$ is manufactured and after that, the electrode $4b$ of the capacitor $Q_2$ is manufactured. As a result, the electrode $4b$ is superposed partly on the gate electrode $4a$. That is, the manufacturing method therefor is called a double-layer polycrystalline silicon method.

According to the second conventional device, after the field layer 2, the insulating layer $3a$ and the gate electrode $4a$ are formed on the substrate 1, n-type impurities are doped into the substrate 1 by ion implantation or thermal diffusion technology with a mask of the gate electrode $4a$, that is, with self-alignment. As a result, an n-type impurity doped region 6 is formed in the substrate 1. After that, the insulating layer $3b$ and the electrode $4b$ are formed. Therefore, the capacitor $Q_2$ is of a depletion type, while the transistor $Q_1$ is of an enhancement type. Such manufacturing technology is the same as that of an E/D type MOS in which transistors having enhancement characteristics and transistors having depletion characteristics are formed and therefore, such technology can be easily introduced so as to increase the charge storage of the capacitor $Q_2$. In this case, the charges stored in the capacitor $Q_2$ are represented by $C_S V_{DD}$, where $C_S$ is an electrostatic capacitance of the capacitor $Q_2$ and $V_{DD}$ is a voltage applied to the electrode $4b$. Therefore, the area occupied by the capacitor $Q_2$ can be reduced as compared with that of FIG. 2.

In FIG. 4, it should be noted that the impurity doped region $5b$ of FIG. 2 is not present, so as to reduce the area of the device of FIG. 4 as compared with the device of FIG. 2.

Figure 5A:
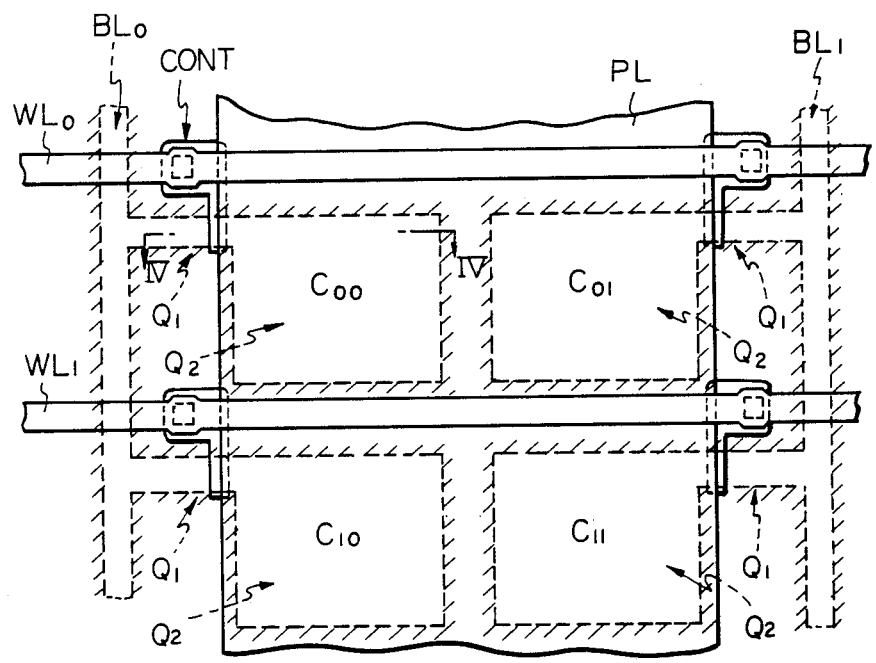
FIGS. 5A and 5B are plan views of two examples of the device of FIG. 4.
Figure 5B:
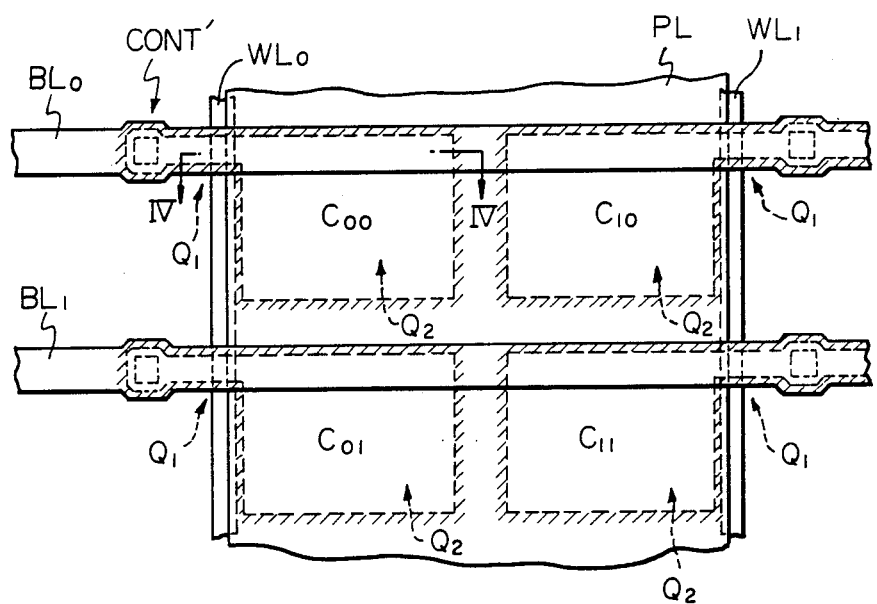

FIGS. 5A and 5B are plan views of two examples of the device of FIG. 4. FIGS. 5A and 5B correspond to the configurations of FIGS. 3A and 3B, respectively. As compared with FIGS. 3A and 3B, the area occupied by the memory cells $C_{00}$, $C_{01}$, $C_{10}$ and $C_{11}$ of FIGS. 5A and 5B can be reduced, since the capacitor $Q_2$ can be reduced and in addition, a field area between the transistor $Q_1$ and the capacitor $Q_2$ is unnecessary due to the absence of the impurity doped region $5b$.

It should be noted that FIG. 4 is a cross-sectional view along the lines IV—IV of FIGS. 5A or 5B.

However, the device of FIG. 4 is still relatively large, even though the device of FIG. 4 is smaller than that of FIG. 2.

Figure 6:
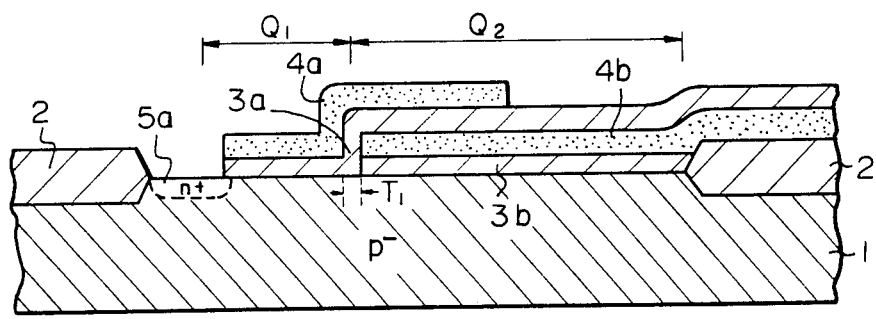
FIG. 6 is a cross-sectional view of a third conventional semiconductor memory device of a one-transistor type.

FIG. 6 is a cross-sectional view of a third conventional semiconductor memory device of a one-transistor type. The device of FIG. 6 can also be manufactured by using a double-layer polycrystalline silicon technology. However, the gate electrode $4a$ of the transistor $Q_1$ which covers the gate regions thereof extend over a part of the electrode $4b$ of the capacitor $Q_2$.

Figure 7:
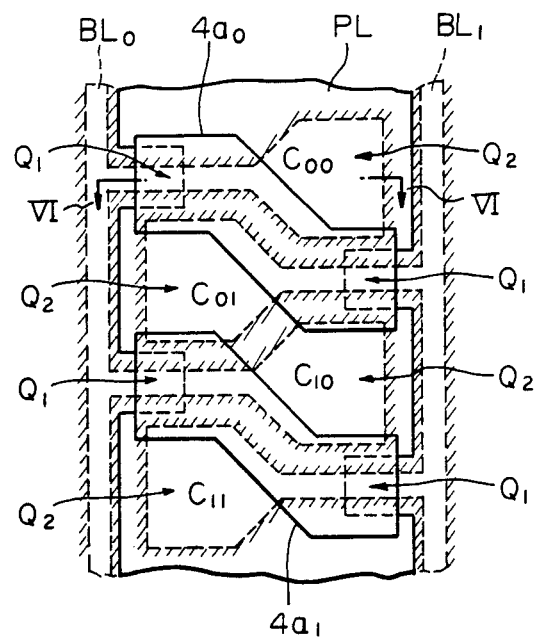
FIG. 7 is a plan view of the device of FIG. 6.

FIG. 7 is a plan view of the device of FIG. 6. In FIG. 7, there are four memory cells $C_{00}$, $C_{01}$, $C_{10}$ and $C_{11}$ each of which corresponds to the device of FIG. 6. In addition, a power supply line PL which is common to all the cells $C_{00}$, $C_{01}$, $C_{10}$ and $C_{11}$, is made of, for example, polycrystalline silicon which is the same as the electrode $4b$ of FIG. 6. Further, bit lines $BL_0$ and $BL_1$ are made of n+-type impurity doped regions, while word lines $WL_0$ and $WL_1$ (not shown) which are made of, for example, aluminum are connected to gate electrodes $4a_0$ and $4a_1$, respectively, which are the same as the gate electrode $4a$ of FIG. 6.

In FIG. 7, it should be noted that, the active areas, which are non-shaded, are interdigitally arranged so as to reduce the field areas which are shaded. That is, the device of FIG. 6 can be of a considerably small size as compared with the devices of FIGS. 2 and 4.

Note that FIG. 6 is a cross-sectional view along the lines VI—VI of FIG. 7.

However, in the above-mentioned third conventional device, there is a problem in that the capacitor $Q_2$ has relatively low efficiency, since the capacitor $Q_2$ is of an enhancement type. In this case, the charges stored in the capacitor $Q_2$ are represented by $C_S(V_{DD}-V_{th})$, where $C_S$ is an electrostatic capacity of the capacitor; $V_{DD}$ is a voltage applied to the electrode $4b$; and $V_{th}$ is a threshold voltage by which an inversion region is formed in the vicinity of the surface of the substrate 1. For example, when the voltages $V_{DD}$ and $V_{th}$ are 5 and 1 volts, respectively, a value of $(V_{DD}-V_{th})$ is 4 volts which means that the charge storage of the capacitor $Q_2$ is reduced by 20 percent as compared with a capacitor of a depletion type.

It is almost impossible to introduce an E/D type MOS manufacturing technology into the device of FIG. 6, since the gate electrode $4a$ is superposed partly on the charge storage portion of the capacitor $Q_2$.

If the capacitor $Q_2$ of FIG. 6 is forced to have depletion characteristics, the following steps may be performed. For example, n-type impurities opposite that of the substrate 1 are doped by ion implantation or thermal diffusion technology to the entire active area, including the transistor $Q_1$ and the capacitor $Q_2$, so as to have depletion characteristics. Next, the electrode $4b$ is formed and after that, p-type impurities are doped by ion implantation or thermal diffusion technology by using the electrode $4b$ as a mask, that is, by self-alignment, so as to contradict the depletion characteristics of the transistor $Q_1$. As a result, only the transistor $Q_1$ returns to the enhancement characteristics, while the capacitor $Q_2$ retains the depletion characteristics. However, in this case, a noticeable impurity scattering effect for carriers is generated so that the mobility of carriers in the channel of the transistor $Q_1$ is reduced and accordingly, the characteristics of operation of the transistor $Q_1$ deteriorate. Thus, since the threshold voltage of the transistor $Q_1$ is determined by donors and acceptors, it is not easy to control the threshold voltage of the transistor $Q_1$.

In addition, in the third conventional device of FIG. 6, there is another problem in that reliability of operation is low and speed of operation is low. This is because the thickness $T_1$ of the insulating layer $3a$ between the two electrodes $4a$ and $4b$ cannot be large due to the absence of the n+-type impurity doped region $5b$ (FIG. 2). Accordingly, the breakdown voltage of the insulating layer $3a$ becomes low, so as to reduce the reliability of operation. In addition, the parasitic capacitance of the gate electrode $4a$ becomes large, so as to invite a low speed of operation.

Contrary to the above, in the present invention, the transistor $Q_1$ and the capacitor $Q_2$ are of a buried channel type (see: K. Nishiuchi et al "Normally-Off Type Buried Channel MOSFET for VLSI Circuits" IEDM Tech. Dig., 1978, pp. 26–29). In addition, the transistor $Q_1$ and the capacitor $Q_2$ are of normally-off and normally-on types, respectively. Therefore, the charge storage in the capacitor $Q_2$ becomes large, that is, the capacitor $Q_2$ can be of a small size. In addition, the physical structure of a device according to the present invention is similar to that of the third conventional device (FIG. 6) which has an advantage in that the field area thereof is very small, since the active areas are interdigitally arranged. Therefore, the device according to the present invention can be highly integrated. Further, the insulating layer between the two conductive layers can be thick due to the presence of the buried channel region. As a result, the operation of the device according to the present invention is high in reliability and high in speed.

Figure 8:
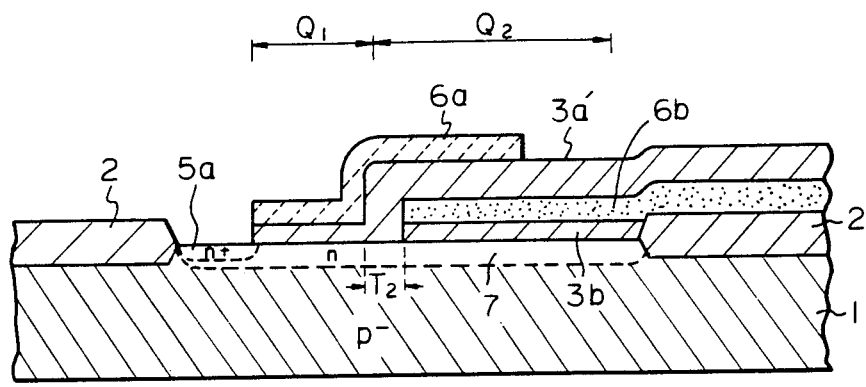
FIG. 8 is a cross-sectional view illustrating an embodiment of the semiconductor memory device of a one-transistor type according to the present invention.

FIG. 8 is a cross-sectional view illustrating a first embodiment of the semiconductor memory device of a one-transistor type. In FIG. 8, the elements which are identical with those of FIG. 6 are denoted by the same reference numerals. In FIG. 8, a material of a gate electrode $6a$ of the transistor $Q_1$, which is a second (upper) conductive layer, is different from a material of an electrode $6b$ of the capacitor $Q_2$, which is a first (lower) conductive layer. The two materials are selected in such a way that the difference in work functions between the gate electrode $6a$ and the substrate 1 is larger than the difference in work functions between the electrode $6b$ and the substrate 1. Therefore, the threshold voltage of the gate electrode $6a$ is higher than that of the electrode $6b$, since a threshold voltage is dependent upon the difference in work functions. In this case, if the electrode $6b$ is made of n-type polycrystalline silicon, the gate electrode $6a$ is made of a p-type impurity strongly doped polycrystalline silicon, or a metal such as molybdenum (Mo), gold (Au), tungsten (W), titanium (Ti) or metal silicide.

In addition, an n-type impurity doped region 7 which is opposite to the conductivity of the substrate 1 is formed in the substrate 1, so that a buried channel (not shown) is produced below the transistor $Q_1$ and the capacitor $Q_2$. As will be explained below, the transistor $Q_1$ is of a normally-off type, while the capacitor $Q_2$ is of a normally-on type, that is, of a depletion type, which increases the charge storage thereof and accordingly, reduces the size of the device.

Further, the insulating layer $3a'$ has a thin portion for the transistor $Q_1$ and in addition, a thick portion surrounding the electrode $6b$ of the capacitor $Q_2$. Therefore, the breakdown voltage of the layer $3a'$ between the electrodes $6a$ and $6b$ becomes large and the parasitic capacitance of the gate electrode $6a$ becomes small.

The manufacturing method for the device of FIG. 8 will now be explained. First, a p-type (100) monocrystalline silicon substrate 1, the resistivity of which is 5 $\Omega$cm, is prepared. Next, a field layer 2 made of silicon dioxide is formed by thermally oxidizing the substrate 1. Then, n-type impurity doped region 7 is formed, for example, by implanting arsenic ions at 50 keV energy into the substrate 1 to $7 \times 10^{11}$ cm$^{-2}$. On the surface of the substrate 1, the insulating layer $3b$ is formed by thermally oxidizing the substrate 1 and in addition, the electrode $6b$ of the capacitor $Q_2$ is formed by CVD (chemical vapor deposition). In this case, the electrode $6b$ is made of polycrystalline silicon to which n-type impurities (for example, phosphorus) are doped. As a result, the capacitor $Q_2$ is of a normally-on type which has a threshold voltage of about $-0.4$ volts. Next, the gate insulating layer $3a'$ is formed by thermally oxidizing the part of the substrate 1, which corresponds to the gate region of the transistor $Q_1$, and the electrode $6b$. In this case, the electrode $6b$ has a high concentration of phosphorus so that the speed of oxidation is higher in the electrode $6b$ than in the substrate 1. This oxidation is called an enhanced oxidation. As a result, as illustrated in FIG. 8, the insulating layer $3a'$ has a thin portion and a thick portion the thickness of which is, in this case, $T_2$. Then, the gate electrode $6a$ is formed and, in addition, the n$^+$-type impurity doped region $5a$ is formed.

Next, the operation of the device of FIG. 8 will now be explained in more detail.

Figure 9A:
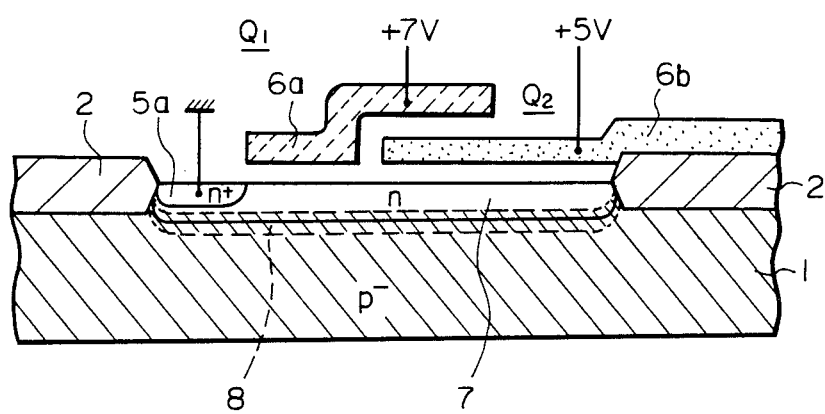
FIGS. 9A and 9B are schematic cross-sectional views for explaining the operation of the device of FIG. 8.
Figure 9B:
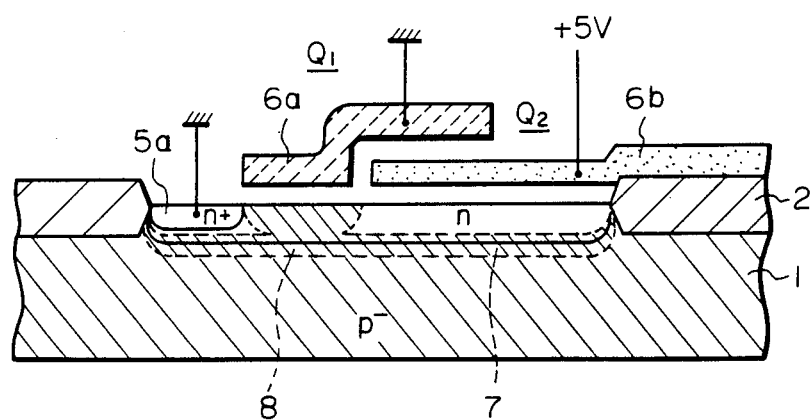

FIGS. 9A and 9B are schematic cross-sectional views for explaining the operation of the device of FIG. 8. In FIGS. 9A and 9B, the insulating layers $3a'$ and $3b$ are omitted in order to easily understand the operation. In FIG. 9A, a voltage which is, for example, $+7$ volts is applied to the gate electrode $6a$ of the transistor $Q_1$ and $+5$ volts is applied to the electrode $6b$ of the capacitor $Q_2$, so that a depletion region 8 is homogeneously generated between the substrate 1 and the n-type impurity doped region 7 which, in this case, forms a buried channel for connecting the impurity doped region (bit line) $5a$ to the capacitor $Q_2$. In this case, the transistor $Q_1$ is in an on-state and the capacitor $Q_2$ is also in an on-state.

Contrary to the above, the gate electrode $6a$ of the transistor $Q_1$ is grounded so as to extend the depletion region 8 below the transistor $Q_1$; in other words, to cut off the n-type impurity doped region 7 below the transistor $Q_1$. In this case, the transistor $Q_1$ is in an off-state, while the capacitor $Q_2$ is in an on-state.

Thus, in FIG. 8, by the difference in work functions between these gate electrodes, the transistor $Q_1$ is of a normally-off type, while the capacitor $Q_2$ is of a normally-on type.

Figure 10:
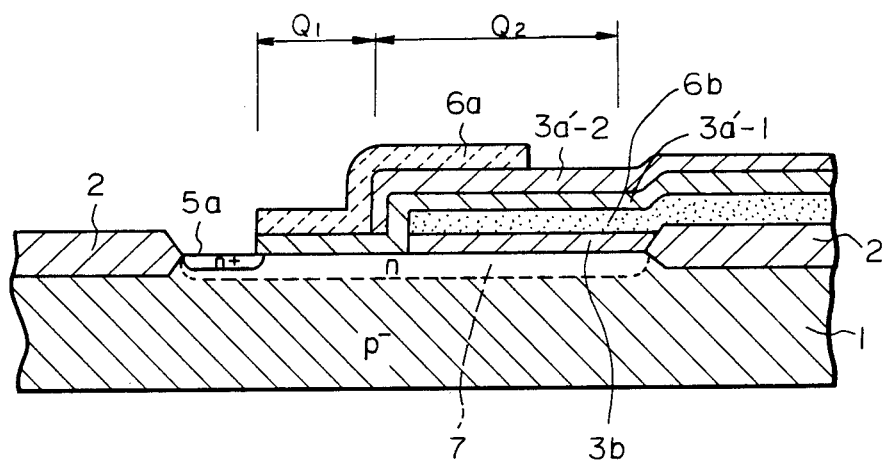
FIG. 10 is a cross-sectional view illustrating another embodiment of the semiconductor memory device according to the present invention.

FIG. 10 is a cross-sectional view illustrating another embodiment of the semiconductor memory device of a one-transistor type according to the present invention. In FIG. 10, the elements which are identical with those of FIG. 8 are denoted by the same reference numerals. In FIG. 10, an insulating layer $3a'$-1 which is made of, for example, alumina (Al$_2$O$_3$) or tantalum oxide (Ta$_2$O$_5$) for stationary charges and an insulating layer $3a'$-2 which is made of, for example, silicon dioxide (SiO$_2$) or silicon nitride (Si$_3$N$_4$) are provided instead of the gate layer $3a'$ of FIG. 8. When the stationary negative charges are introduced into the insulating layer $3a'$-1, the threshold voltage of the transistor $Q_1$ is increased. Therefore, the operation of the device of FIG. 10 is the same as that of the device of FIG. 8. It should be noted that the insulating layer $3a'$-2 is used for compensating the breakdown voltage of the insulating layer $3a'$-1

As explained hereinbefore, the semiconductor memory device of a one-transistor type according to the present invention has the following advantages as compared with the third conventional device.

(1) The integrated density is high, since the capacitor $Q_2$ is of a normally-on type so as to increase the charge storage thereof.

(2) The operation of the device is high in reliability and high in speed, since the insulating layer between the two conductive layers $6a$ and $6b$ can be thick so as to increase the breakdown voltage and to reduce the parasitic capacitance.

I claim:

1. A semiconductor memory device of a one-transistor type, comprising:
   a semiconductor substrate of a first conductivity type and having a work function, comprising:
      a first impurity doped region of a second conductivity type opposite the first conductivity type; and
      a second impurity doped region of the second conductivity type formed within said first impurity doped region, said second impurity doped region having a higher concentration of impurities than said first impurity doped region;
   a first insulating layer disposed over a portion of said first impurity doped region;
   a first conductive layer disposed on said first insulating layer and having a first work function different from the work function of said semiconductor substrate, the difference between the first work function and the work function of said semiconductor substrate being determined so that a depletion region in said semiconductor substrate under said first conductive layer covers only part of said first impurity region under said first conductive layer when a first predetermined voltage is applied to said first conductive layer;
   a second insulating layer having a thin portion disposed directly on said first impurity doped region and having a thick portion extending over said first conductive layer;
   a second conductive layer disposed on said second insulating layer and having a second work function different from the work function of said semiconductor substrate, the difference between the second work function and the work function of said semiconductor substrate being determined so that the depletion region of said semiconductor substrate under said second conductive layer substantially completely covers said first impurity region under said second conductive layer, when a second predetermined voltage is applied to said second conductive layer;

a buried-channel normally-off type transistor having a source and drain corresponding to said second and first impurity doped regions, respectively, having a channel corresponding to said first impurity doped region, formed directly below said thin portion of said second insulating layer, and having a gate electrode corresponding to said second conductive layer; and a normally-on type capacitor comprising a first electrode corresponding to said first impurity doped region and a second electrode corresponding to said first conductive layer.

2. A device as set forth in claim 1, wherein said second insulating layer includes therein stationary charges.

3. A device as set forth in claim 1, wherein said semiconductor substrate comprises monocrystalline silicon.

4. A device as set forth in claim 1, wherein said semiconductor substrate, said first conductive layer and said second conductive layer comprise p-type monocrystalline silicon, n-type impurity doped polycrystalline silicon and p-type impurity doped polycrystalline silicon, respectively.

5. A device as set forth in claim 1, wherein said semiconductor substrate, said first conductive layer and said second conductive layer comprise p-type monocrystalline silicon, n-type impurity doped polycrystalline silicon and metal, respectively.

6. A device as set forth in claim 1, wherein said semiconductor substrate, said first conductive layer and said second conductive layer comprise p-type monocrystalline silicon, n-type impurity doped polycrystalline silicon and metal silicide, respectively.

7. A device as set forth in claim 5, wherein said metal is molybdenum (Mo).

8. A device as set forth in claim 5, wherein said metal is gold (Au).

9. A device as set forth in claim 5, wherein said metal is tungsten (W).

10. A device as set forth in claim 5, wherein said metal is titanium (Ti).

11. A device as set forth in claim 2, wherein said first and second conductive layers comprise polycrystalline silicon.

12. A device as set forth in claim 2, wherein said second insulating layer comprises silicon dioxide ($SiO_2$).

13. A device as set forth in claim 2, wherein said second insulating layer comprises silicon nitride ($Si_3N_4$).

14. A device as set forth in claim 2, wherein said second insulating layer comprises alumina ($Al_2O_3$).

15. A device as set forth in claim 2, wherein said second insulating layer comprises tantalum oxide ($Ta_2O_5$).

16. A device as set forth in claim 14, wherein said thick portion of said second insulating layer extending over said first conductive layer comprises silicon dioxide.

17. A device as set forth in claim 1, wherein said first and second insulating layers are made of silicon dioxide.

18. A device as set forth in claim 1, wherein said semiconductor substrate and said first conductive layer comprise p-type monocrystalline silicon and polycrystalline silicon having n-type impurities doped therein, respectively, and said second insulating layer comprises a thermal silicon oxide layer.

* * * * *